United States Patent [19]
Boksiner et al.

[11] Patent Number: 5,359,293
[45] Date of Patent: Oct. 25, 1994

[54] ELECTRICAL CABLE ARCING FAULT DETECTION BY MONITORING POWER SPECTRUM IN DISTRIBUTION LINE

[75] Inventors: Jeffrey Boksiner, Landing; Edward J. Silverman, Rockaway, both of N.J.

[73] Assignee: Bell Communications Research, Inc., Livingston, N.J.

[21] Appl. No.: 71,916

[22] Filed: Jun. 3, 1993

[51] Int. Cl.$^5$ .................. G01R 31/02; H01H 3/24
[52] U.S. Cl. .................... 324/544; 324/536; 340/647; 361/90; 379/26
[58] Field of Search ........ 324/520, 536, 539, 541–544, 324/555, 556, 158 MG, 126, 102; 340/647, 659, 662; 379/26; 361/88, 90–92, 62

[56] References Cited

U.S. PATENT DOCUMENTS

| | | | |
|---|---|---|---|
| 3,904,839 | 9/1975 | Peoples | 324/520 X |
| 4,156,846 | 5/1979 | Harrold et al. | 324/158 MG |
| 4,577,151 | 3/1986 | Tanioaka et al. | 324/102 X |
| 4,639,817 | 1/1987 | Cooper et al. | 361/88 X |
| 4,853,820 | 8/1989 | Ham, Jr. et al. | 361/59 |
| 4,879,625 | 11/1989 | Potenzone | 361/90 |
| 4,980,645 | 12/1990 | Soma et al. | 324/544 X |
| 4,983,955 | 1/1991 | Ham, Jr. et al. | 340/664 |
| 5,047,724 | 9/1991 | Boksiner et al. | 324/520 |
| 5,049,815 | 9/1991 | Kliman | 324/158 MG |
| 5,223,795 | 6/1993 | Blades | 324/520 X |
| 5,256,977 | 10/1993 | Domenichini et al. | 324/520 X |

FOREIGN PATENT DOCUMENTS

WO2008143 5/1992 PCT Int'l Appl. ............. 324/536

*Primary Examiner*—Gerard R. Strecker
*Assistant Examiner*—Diep Do
*Attorney, Agent, or Firm*—Leonard Charles Suchyta; Lionel N. White

[57] ABSTRACT

A system for detecting arcing faults in DC electrical cable power distribution circuits, typically in telecommunications networks, monitors the power spectrum of distribution lines over a frequency band of about 4 Hz to 5 KHz in which current surges characteristic of arcing line faults have been found to occur. The system compares power levels in this detection band with a threshold level typical of normal communications traffic and registers an alarm condition when an excess indicative of arcing is detected.

12 Claims, 3 Drawing Sheets

ELECTRICAL CABLE ARCING FAULT DETECTION BY MONITORING POWER SPECTRUM IN DISTRIBUTION LINE

BACKGROUND OF THE INVENTION

The present invention relates to a system for detecting an arcing fault in a DC electrical power cable; in particular, for detecting such a fault occurring in the DC power distribution system of a telecommunications network.

Arcing from electrical power cables at points of worn or damaged insulation constitutes a significant fire hazard in most building environments. This is particularly so in telephone company central offices which may remain unoccupied for considerable lengths of time. Although the DC power supply systems in these locations include protective devices, such as fuses and circuit breakers, to ensure interruption of dangerous current flow in the event of a short circuit or overload, the level and duration of momentary current surge at the instant of arcing are usually insufficient to actuate such protection devices. The heat accompanying such arcing is, however, quite capable of initiating a destructive fire.

There is thus a definite need for means by which arcing in a faulty or damaged electrical system may be detected and an alert or disconnect signal given in time to avert serious losses. An earlier detection system described in U.S. Pat. No. 5,047,724 provided such a means which operated through recognition of a characteristic frequency domain energy distribution pattern generated by the arcing itself. By continually monitoring the power supply system for the appearance of such a pattern, that earlier detection device was able to provide early warning of a hazardous arcing condition.

The present invention provides a simpler and less expensive detection device which responds directly to over-threshold levels of increased current flow indicated within a lower frequency spectrum band during an arcing event in a DC power distribution system.

SUMMARY OF THE INVENTION

As a result of our examining the effects of arcing in systems with high performance DC power supplies, e.g. battery strings which are utilized to support telephone central office operations, we have discovered that the frequency domain energy distribution pattern, or power spectrum, of current flow in such a system changes characteristically at instances of arcing, particularly in the lower frequency range, from those of normal operation. Therefore, by monitoring power system current flow within that frequency band one is able to obtain an early warning of the existence of a dangerous arcing condition.

In the present invention, the current flow in a power distribution system is continuously monitored as a voltage level across a series resistor conveniently located in a power supply cable; for example, at a primary feeder plant shunt or secondary feeder overcurrent protection device commonly found in such lines. Voltage indicative of the total current flow in the system over a selected frequency range of about 4 Hz to 5 KHz, as limited by band-pass filters, is compared with a predetermined threshold level. Excursions beyond a selected threshold are utilized to trigger an alarm to notify operating personnel of the existence of arcing danger, or they may be employed to activate a circuit breaker or similar means to initiate a complete isolation of the power source.

BRIEF DESCRIPTION OF THE DRAWING

The present invention will be described with reference to the accompanying drawing of which.

DESCRIPTION OF THE INVENTION

Figure 1:
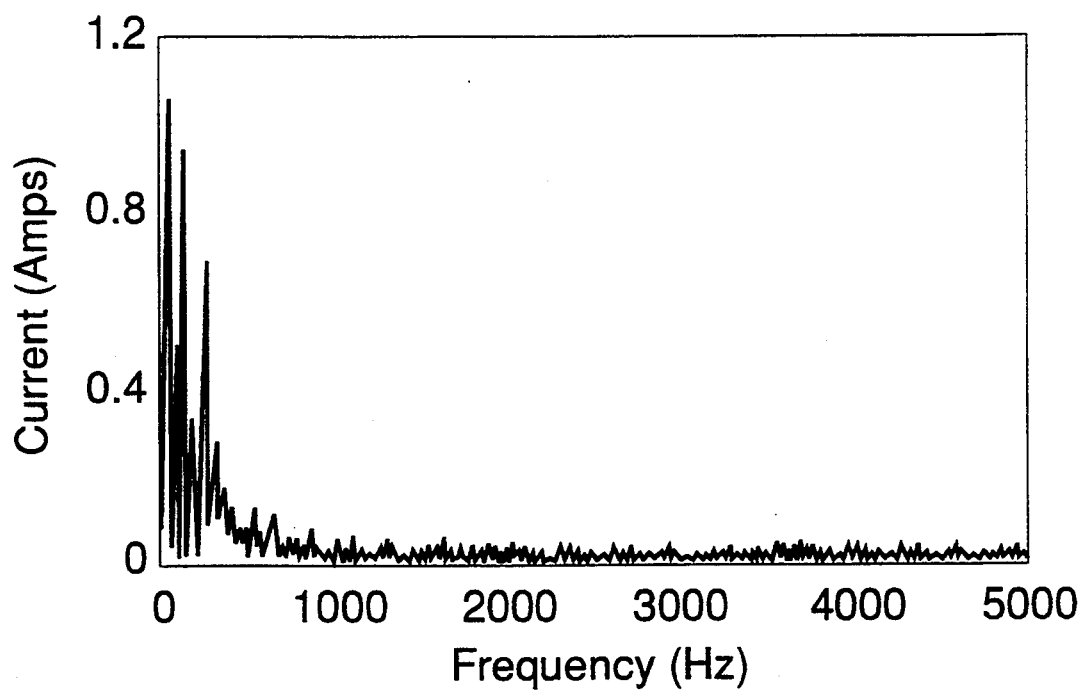
FIG. 1 is a frequency spectrum trace indicative of current variations occurring in a DC power distribution system as background noise during normal operation.

The DC current flow in a number of telecommunications network power systems was monitored continuously over a period of several months and the current measurements were analyzed in the frequency domain. A typical plot of variations in current as a function of frequency up to about 5 KHz in a normally operating system is shown in FIG. 1. The shape and magnitude of the plot is generally characteristic of the noise spectra of central office DC power systems.

Figure 2:
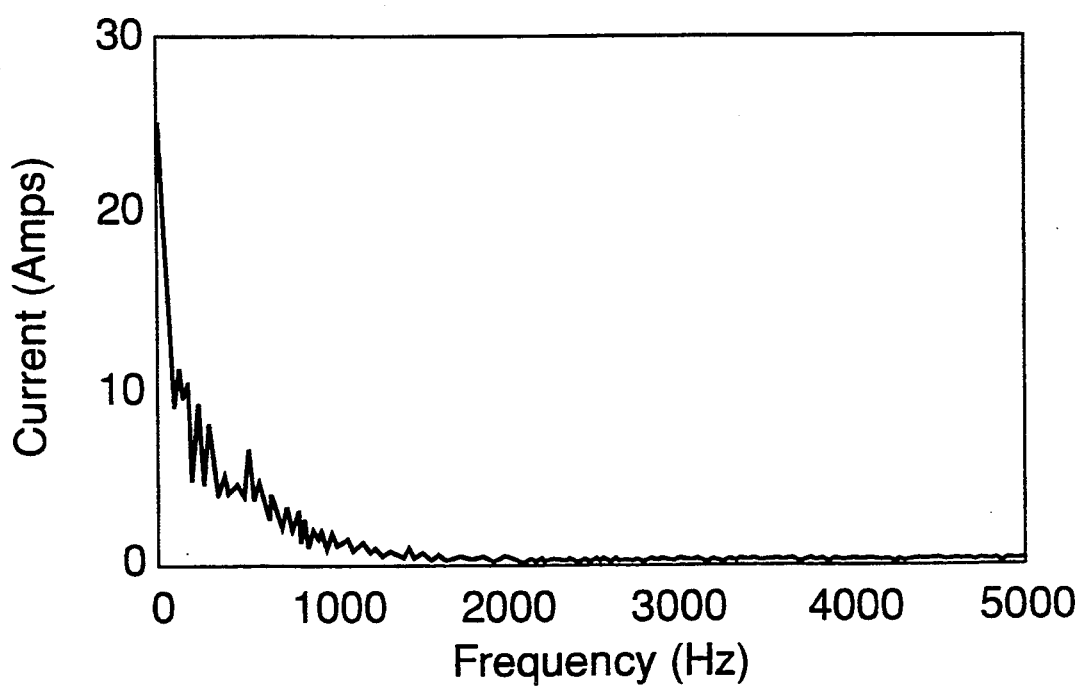
FIG. 2 is a frequency spectrum trace indicative of current variations occurring in such a distribution system during an arcing event.

Hundreds of arcing faults were produced in a simulated telephone central office power system utilizing various cables, equipment racks, and other objects indigenous to such office locations. The frequency spectra of the arcing events were derived from measurements of the current flow and typically appeared as depicted in FIG. 2. Although generally of similar shape, the normal noise and arcing fault spectra can be seen to have significantly different magnitude. An arc detection device of the present invention senses the magnitude of arcing event current flow over the predominant spectrum bandwidth and provides a signal to trigger an alarm or current interrupter.

Figure 3:
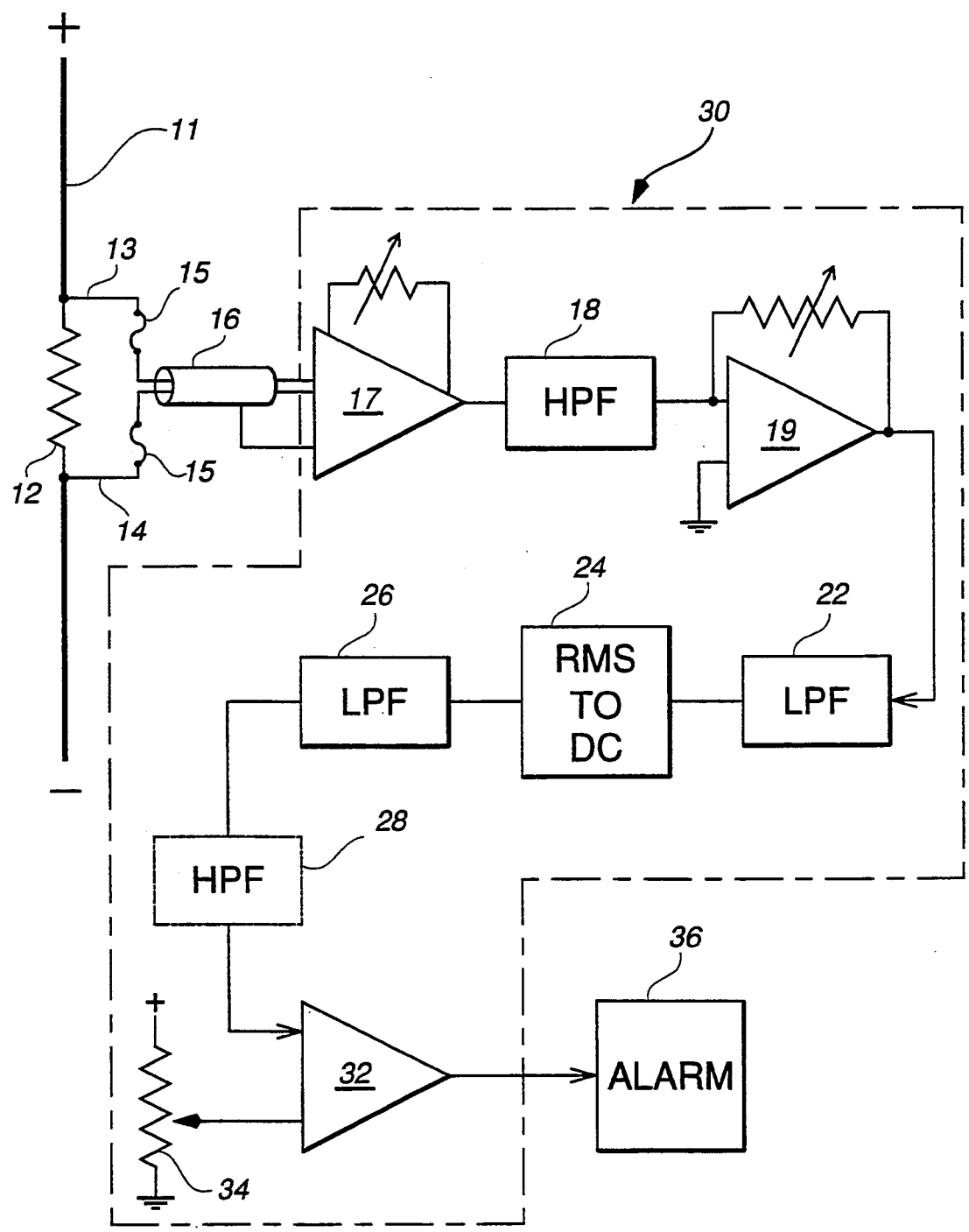
FIG. 3 is a schematic diagram of an embodiment of an arc detection system according to the present invention.

An embodiment of such an arc detection device 30 is represented schematically in FIG. 3 and comprises means for detecting variations in voltage occurring as a function of current flow in a DC power line, determining the intensity of the resulting voltage signal over a predetermined frequency bandwidth, and comparing that signal intensity with a preselected threshold voltage to determine whether an alarm condition exists. As shown in FIG. 3, the detection device is arranged to monitor the current flow in DC power distribution feeder 11 and across feeder line shunt resistor 12. Typical of such calibrated measuring devices commonly employed in central office systems, this shunt may be rated in the range 500 A/50 mV to 250 A/50 mV and thus provides a resistance of about 0.1–0.2 milliohm. In the event that a main power plant shunt is employed in a detection system, its considerably lower resistance would require higher gain settings.

The voltage levels across shunt 12 vary with the current flow in line 11 and provide the primary input signal for the detection device. This signal is directed to first stage differential amplifier 17 over test leads 13, 14 which are protected by fuses 15 and comprise, with shielding 16, a twisted-pair (twinaxial) cable limiting induced noise. Amplifier 17 may be an AD624 precision instrumentation amplifier (Analog Devices, Inc., Norwood, Mass.) which provides variable gain of 100, 200, 500, or 1000. In the present embodiment, the monitored signal is amplified to a gain of 200 in order to ultimately provide, with subsequent amplification, an arc event signal with a total power level in the detection band in the range of 1 to 5 volts. After this initial amplification, the signal proceeds to 4 Hz high pass Butterworth filter 18 (TTE Inc., Los Angeles, Calif.) which, in addition to establishing the low-frequency limit of the signal bandwidth, removes the DC component and thus, in effect, performs part of the detection function.

Upon further predetermined gain in AD711 operational amplifier 19 to effect an overall gain of about 500, the signal is directed to 5 KHz low pass Butterworth filter 22 to establish the detection bandwidth. The resulting signal is then processed in an AD637 RMS-to-DC converter 24 to obtain the integrated voltage signal intensity over the 4 Hz to 5 KHz bandwidth which is indicative of the level of current being transmitted in line 11. A simple low pass filter 26 with a cut-off frequency at about 1.33 Hz smooths the signal and an optional 0.07 Hz high pass filter 28, e.g., a single pole Butterworth filter, may be used to remove the steady-state noise of the DC power distribution system.

Figure 4:
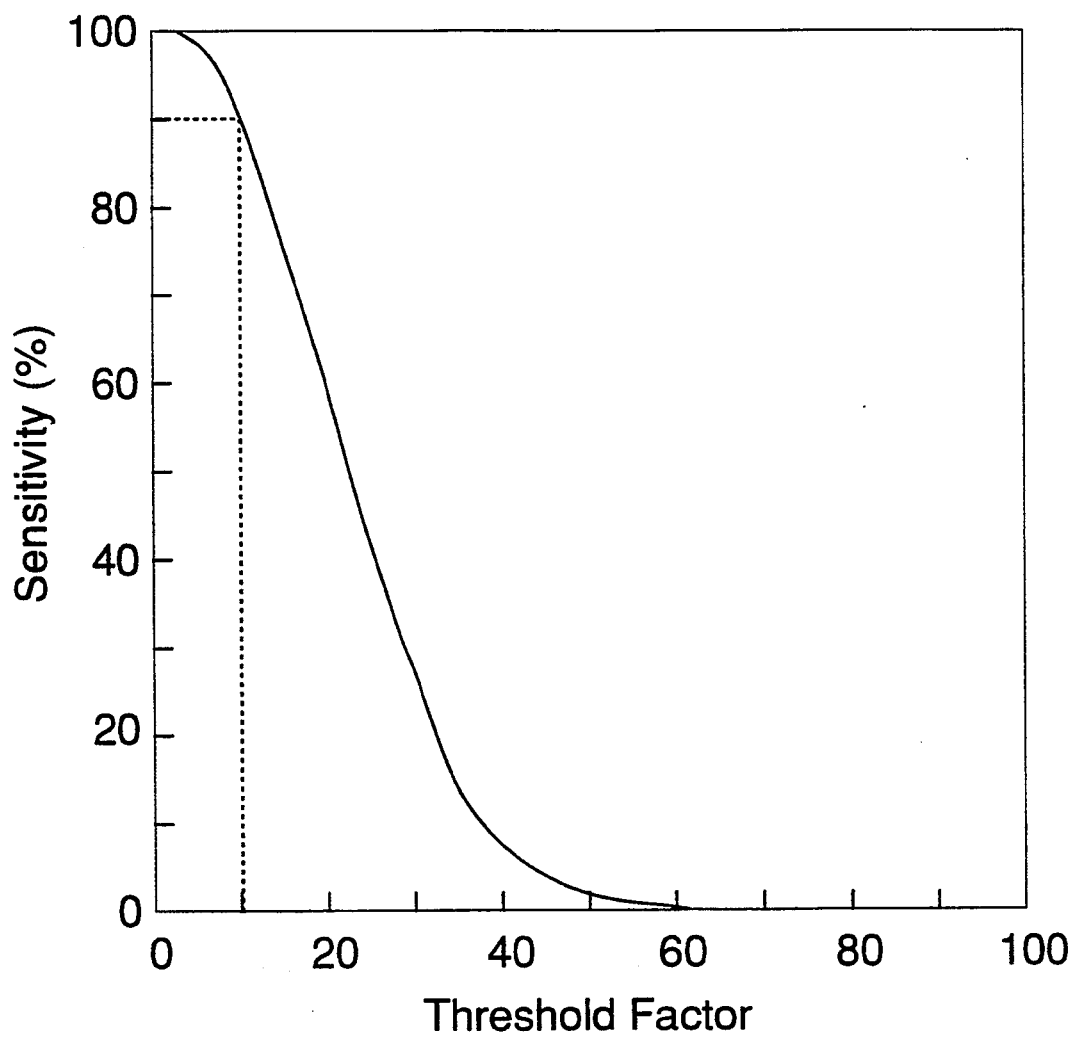
FIG. 4 is a graphic guide for selection of threshold factor as a function of desired sensitivity in a detection system according to FIG. 3.

The processed signal is at this stage directed to comparator 32, which may be an AD790 precision comparator device, to be measured against a preselected threshold voltage from variable EMF source 34. The threshold setting depends primarily upon the ambient noise current and the desired sensitivity of the detection system, that is, the percentage of arcing events which will result in a triggering signal for a particular power system. In the present exemplary embodiment with ambient feeder noise at about 100–200 mV, and based upon extensive arcing fault simulations, it is expected that a sensitivity of more than about 90 % would be obtained from a threshold setting of about 400–500 mV. The graph of FIG. 4 was derived from data of such simulations and provides a general guide for detection comparator settings. From this guide, one may estimate the appropriate threshold setting for a desired sensitivity by multiplying the threshold factor by the product of the shunt resistance and the applied detection system gain. Thus, in the present example the threshold setting of about 400–500 mV to achieve about 90% sensitivity is the product of the 0.1 milliohm shunt resistor, the system gain of 500, and the threshold factor of about 10.

When, in an operating system, an arcing fault occurs which is of sufficient scale to be detected, comparator 32 produces a triggering signal, e.g., one which persists for at least about 250 msec, which is directed to a responsive safety device, generally represented in FIG. 3 as alarm 36. Such a device may in fact be any common apparatus which responds to a triggering signal by generating a visible or audible alarm, or it may be one of the many available circuit breaker or other power interrupting systems. Other variants of the present invention will undoubtedly become apparent to the skilled artisan in the light of the foregoing description, and those and similar embodiments are nonetheless in tended to be within the scope of the invention as recited in the appended claims.

What is claimed is:

1. A method of detecting an arcing fault in a DC electrical power distribution line which comprises monitoring the power spectrum over a predetermined frequency bandwidth for current flowing in said line characterized in that
   a) a voltage signal is created varying as a function of said current flow;
   b) the varying intensity of said voltage signal over said frequency bandwidth is determined; and
   c) said voltage signal intensity is compared with a preselected threshold voltage to determine the existence of an excessive voltage level indicative of an arcing fault.

2. A method according to claim 1 characterized in that the existence of an excessive voltage level provides a signal triggering a responsive device.

3. A method according to claim 2 characterized in that said responsive device is an alarm or a protective device.

4. A method according to claim 1 characterized in that said voltage signal is created by means of a resistor in said distribution line.

5. A method according to claim 1 characterized in that said frequency bandwidth is between about 4 Hz and 5 KHz.

6. A system for detecting an arcing fault in an electrical power distribution line which comprises means for monitoring the power spectrum over a predetermined frequency bandwidth for current flowing in said line characterized in that said system comprises:
   a) means for creating a voltage signal varying as a function of said current flow;
   b) means for determining the varying intensity of said voltage signal over said frequency bandwidth; and
   c) means for comparing said voltage signal intensity with a preselected threshold voltage to determine the existence of an excessive voltage level indicative of an arcing fault.

7. A system according to claim 6 characterized in that said means for creating said voltage signal comprises a resistor in said distribution line.

8. A system according to claim 6 characterized in that said means for determining said voltage signal intensity integrates the power of said signal over said frequency bandwidth.

9. A system according to claim 8 which further comprises filter means for determining said frequency bandwidth.

10. A system according to claim 9 wherein said filter means limits said frequency bandwidth to a range of between about 4 Hz and 5 KHz.

11. A system according to claim 6 characterized in that
   a) said comparing means provides a triggering signal upon determining the indication of an arcing fault; and
   b) said system further comprises a device responsive to said triggering signal.

12. A system according to claim 11 characterized in that said responsive device is an alarm or a protective device.

* * * * *